United States Patent [19]
Quigley et al.

[11] Patent Number: 5,825,640
[45] Date of Patent: Oct. 20, 1998

[54] CHARGE PUMP CIRCUIT AND METHOD

[75] Inventors: John H. Quigley, Phoenix; David A. Newman, Tempe, both of Ariz.

[73] Assignee: Motorola, Inc., Schaumburg, Ill.

[21] Appl. No.: 885,970

[22] Filed: Jun. 30, 1997

[51] Int. Cl.$^6$ ............................. H02M 3/18; H03L 7/06
[52] U.S. Cl. ............................. 363/60; 327/157; 331/17
[58] Field of Search ............................. 363/60; 331/17, 331/25; 327/157

[56] References Cited

U.S. PATENT DOCUMENTS

| | | | |
|---|---|---|---|
| 5,008,635 | 4/1991 | Hanke et al. | |
| 5,473,283 | 12/1995 | Luich | 331/17 |
| 5,576,647 | 11/1996 | Sutardja et al. | 327/157 |
| 5,592,113 | 1/1997 | Quiet et al. | 327/157 |
| 5,646,563 | 7/1997 | Kuo | 327/157 |

OTHER PUBLICATIONS

D. Mijuskovic et al., "Cell–Based Fully Integrated CMOS Frequnecy Synthesizers", IEEE Journal of Solid–State Circuits, Mar. 3, 1994, vol. 29, No. 3, pp. 271–278.

Floyd M. Gardner, "Charge–Pump Phase–Lock Loops", IEEE Transactions on Communications, vol. COM–28, No. 11, Nov. 1980, pp. 321–330.

*Primary Examiner*—Stuart N. Hecker
*Attorney, Agent, or Firm*—Robert D. Atkins

[57] ABSTRACT

A circuit and method produce a pump current ($I_p$) at the output (31) of a charge pump (26). A switching transistor (32, 35) is coupled at a node (38, 39) to a current source transistor (33, 34) to produce the pump current at a specified magnitude in response to an input pulse ($V_{PU}$, $V_{PD}$). A charge is stored on a parasitic capacitance of the node. A charge conduction path (42, 43) is coupled to the node and enabled on one transition edge of the input pulse to alter the charge by routing to a discharge node (45) to reduce charge flowing to the output as an error current. The charge conduction path is disabled on the other transition edge of the input pulse to isolate the node from the output.

23 Claims, 3 Drawing Sheets

26

26

CHARGE PUMP CIRCUIT AND METHOD

BACKGROUND OF THE INVENTION

The present invention relates in general to integrated circuits, and more particularly to a circuit for reducing error in a charge pump circuit.

Portable wireless communications systems are using digital techniques to increase system functionality while reducing manufacturing cost. For example, pagers can reduce the number of external tuning components by using digital tuning to select a radio frequency (RF) carrier signal modulated with an audio or video signal. A phase locked loop or frequency synthesizer includes a voltage controlled oscillator (VCO) for producing a local oscillator signal which is mixed with the RF signal to produce an intermediate frequency (IF) signal from which the audio and video signals are extracted. A digital phase/frequency detector compares the phase relationship between the local oscillator signal and a reference signal to produce digital detection pulses which are converted to proportional pump current pulses at the output of a charge pump. A loop filter develops the pump current pulses into an analog control voltage for adjusting the VCO to align the frequencies of the local oscillator and reference signals.

The pump current is kept at a low magnitude to minimize current drain and to allow fine adjustments to be made to the VCO for reducing phase noise when the local oscillator and referenced signals are locked. However, such low current operation increases the sensitivity to pump current errors arising when charge stored on parasitic capacitances in the charge pump flows to the output in response to an input switching transition. For example, at the trailing edge of a detection pulse, parasitic capacitance delays the current switch from turning off until the stored charge is depleted by flowing through the current switch to the output as an error current. The error current is integrated and applied to the VCO, increasing phase jitter in the local oscillator signal and producing demodulation errors in the communications device.

Prior art charge pumps reduce such error currents by routing the stored charge away from the charge pump output through a discharge capacitor after a detection pulse transition. A problem with prior art charge pumps is that the discharge capacitor adds even more parasitic capacitance to the current switch, which increases the amount of stored charge. Even though the discharge capacitor reduces error at the trailing edge of the detection pulse, the increased charge across the capacitor flows to the output as a pump current error at the leading edge of the detection pulse.

Hence, there is a need for an improved charge pump operating at a low current level and having a reduced pump current error to reduce system noise in a portable communications device.

DETAILED DESCRIPTION OF THE DRAWINGS

Figure 1:
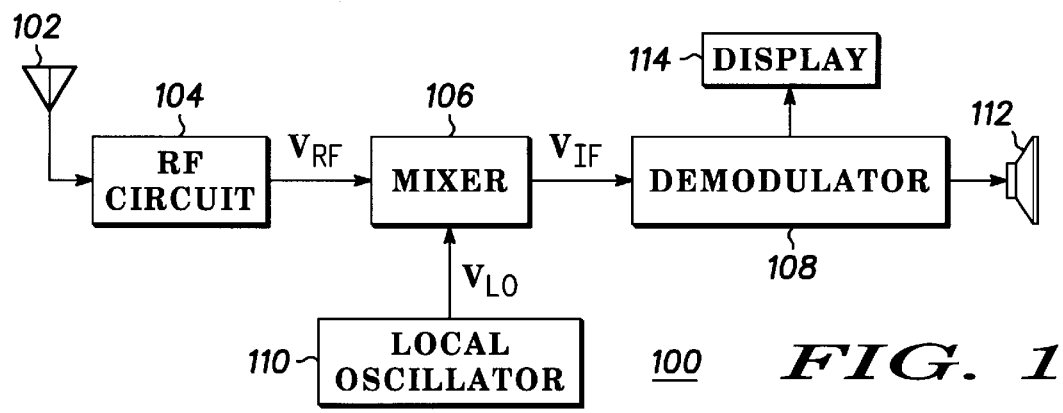
FIG. 1 is a block diagram of a wireless communications device.

FIG. 1 is a block diagram of a wireless communications device 100 such as a cellular telephone, two-way radio or pager. A receiver circuit in communications device 100 includes an antenna 102, a radio frequency (RF) circuit 104, a mixer 106, and a demodulator 108. Antenna 102 receives a transmitted RF carrier signal modulated with digital and/or analog information for amplifying in RF circuit 104 to produce an amplified RF signal $V_{RF}$. A local oscillator 110 produces a local oscillator signal $V_{LO}$ used for downconverting $V_{RF}$ in mixer 106 to produce a modulated intermediate frequency (IF) signal $V_{IF}$. Demodulator 108 extracts the modulated information from $V_{IF}$ to produce a video signal to drive a display device 114 and an audio signal to drive a speaker 112. Communications device 100 is typically a portable device operated from a low voltage battery (not shown) operating at $V_{DD}$=3.0 volts.

Figure 2:
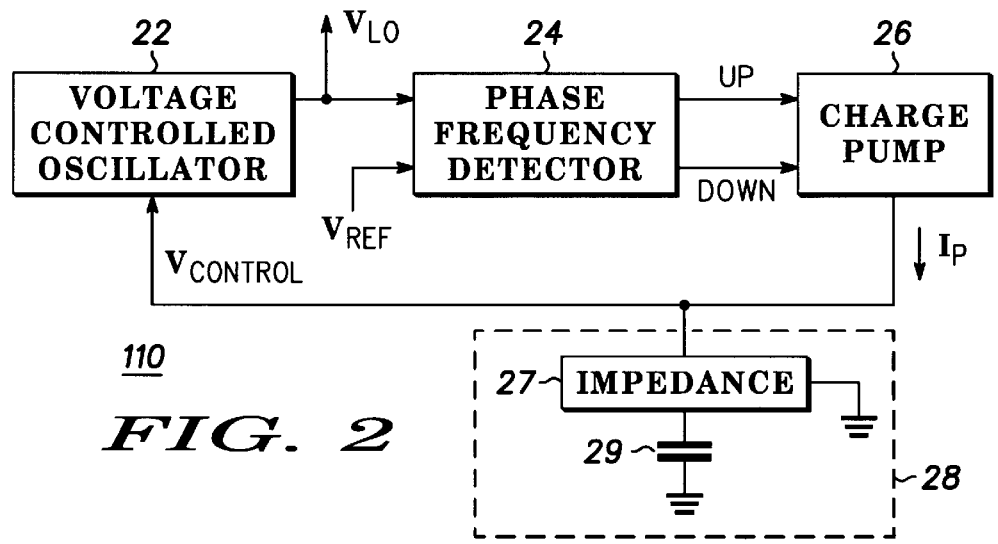
FIG. 2 is a block diagram of a local oscillator circuit.

FIG. 2 is a block diagram of local oscillator 110 configured as a phase locked loop and including a voltage controlled oscillator (VCO) 22, a phase/frequency detector (PFD) 24, a charge pump 26 and a filter circuit 28 for implementing on an integrated circuit. In the figures, elements having the same reference number perform similar functions. Local oscillator signal $V_{LO}$ is generated at the output of VCO 22 for applying to an input of PFD 24. The $V_{LO}$ frequency is adjusted by integrating a pump current $I_p$ with filter 28 to derive an analog control signal $V_{CONTROL}$ applied to a control input of VCO 22.

PFD 24 receives a reference signal $V_{REF}$ operating at a predetermined reference frequency which can be generated by a crystal controlled reference oscillator (not shown) to achieve a high degree of stability over a range of operating conditions. PFD 24 can include prescalers to provide frequency reduction for operating at lower currents. PFD 24 can also include programmable frequency dividers to provide for frequency synthesis or digital tuning. In one embodiment in which $V_{REF}$ is set to operate at 3.125 kilohertz, PFD 24 includes frequency dividers to divide $V_{LO}$ by approximately 70,000 such that the operating frequency of $V_{LO}$ is approximately 212 megahertz.

PFD 24 can be implemented in a number of alternative configurations to produce digital detection pulses UP and DOWN indicative of the phase or frequency relationship of $V_{LO}$ to $V_{REF}$. For example, in one embodiment PFD 24 uses sequential logic such as latches and logic gates to produce UP and DOWN pulses to indicate when $V_{LO}$ is not in phase with $V_{REF}$, activating UP when $V_{LO}$ leads $V_{REF}$ in phase and DOWN when $V_{LO}$ lags $V_{REF}$ in phase. Alternatively, PFD 24 can incorporate combinatorial logic such as multiplier circuits, rather than sequential logic, to produce similar UP and DOWN pulses when $V_{LO}$ and $V_{REF}$ are out of quadrature.

PFD 24 senses transition edges on each cycle of $V_{LO}$ and $V_{REF}$ to initiate transition edges of UP or DOWN as appropriate. For example, if $V_{REF}$ leads in phase, UP is set to the active state (e.g., high) by a leading edge of $V_{REF}$ and reset to an inactive state (e.g., low) by the next leading edge of $V_{LO}$, while DOWN remains in the inactive state. When $V_{LO}$ leads in phase, a DOWN pulse is similarly initiated on a leading edge of $V_{LO}$ and terminated on the next leading edge of $V_{REF}$. UP and DOWN are not both active at the same time. However, UP and DOWN can both be inactive at the same time, such as when $V_{REF}$ and $V_{LO}$ are frequency or phase locked. The respective pulse widths of UP and DOWN are proportional to the phase difference between $V_{LO}$ and $V_{REF}$.

Charge pump 26 operates as a current switch that switches current pulses of a predetermined amplitude to produce pump current $I_p$ in response to detection pulses UP and DOWN. An $I_p$ current pulse has the same pulse width as a pulse of UP or DOWN, and therefore is also proportional to the phase difference between $V_{LO}$ and $V_{REF}$. The $I_p$ pulses effectively supply charge packets of one polarity in response to UP and the opposite polarity in response to DOWN. The charge packets are integrated by filter 28 to produce $V_{CONTROL}$. For example, when UP is active, $I_p$ may supply a current that increases the charge on filter 28, so that when DOWN is active, $I_p$ has the opposite polarity to reduce the charge on filter 28.

Filter 28 is shown as comprising an impedance circuit 27 and a capacitor 29 serially coupled between the output of charge pump 26 and ground. Capacitor 29 provides the integrating function, storing the charge packets from charge pump 26. Impedance circuit 27 includes components which provide a desired loop response and which increase the phase margin to ensure loop stability. It should be evident that filter 28 could alternatively be implemented using active components such as amplifiers or using a more complex network of passive components, depending on system requirements. The $I_p$ charge packets are proportional to the phase difference between $V_{LO}$ and $V_{REF}$ to reduce the lock time of local oscillator 110 by providing a greater adjustment in $V_{CONTROL}$ when $V_{LO}$ and $V_{REF}$ are farther apart in phase or frequency.

$I_p$ is set to a low current level to make finer adjustments to $V_{CONTROL}$ when $V_{LO}$ and $V_{REF}$ are locked, thereby reducing noise and extending the time between battery recharges. Such low current operation increases the sensitivity to pump current errors arising when charge stored on parasitic capacitances flows to the output of the charge pump. The parasitic capacitances include junction and gate oxide capacitance as well as accumulation charge stored in the channels of transistors of the charge pump. Such charges are pump current errors because the resulting pump current pulse is not proportional to the phase difference between the local oscillator and reference frequencies. The pump current errors are developed by the filter into a corresponding error in the VCO control voltage which causes an overadjustment of the VCO and increases phase jitter and noise.

For example, a typical prior art charge pump includes a current conduction path for supplying the pump current to the output of the charge pump. The current conduction path includes a switching transistor responsive to a detection pulse and coupled at a switching node to a current source transistor biased to set the pump current level. At the leading edge of a detection pulse, the switching transistor is enabled to provide a relatively low impedance to rapidly charge the parasitic capacitance, thereby producing a minimal pump current error. However, at the trailing edge, the switching transistor is disabled, which sets the switching node to a high impedance state. The stored charge flows to the output through the current source transistor, which momentarily continues to conduct until the charge is depleted. A filter integrates the error to produce a corresponding error in the VCO control voltage, causing an overadjustment of the VCO and increasing phase jitter and noise.

One prior art charge pump reduces the error by routing the stored charge through a capacitor coupled to the switching node. The capacitor often is implemented with a transistor structure having a common drain-source connection operating as one capacitor electrode and a gate operating as the other capacitor electrode. However, such a capacitor adds substantial capacitance to the switching node, which results in more charge being stored. Because the capacitor is enabled on both transitions of the detection signal, the increased charge on the switching node delays turning on the switching transistor to produce a pump current error at the leading edge of the detection pulse.

Figure 3:
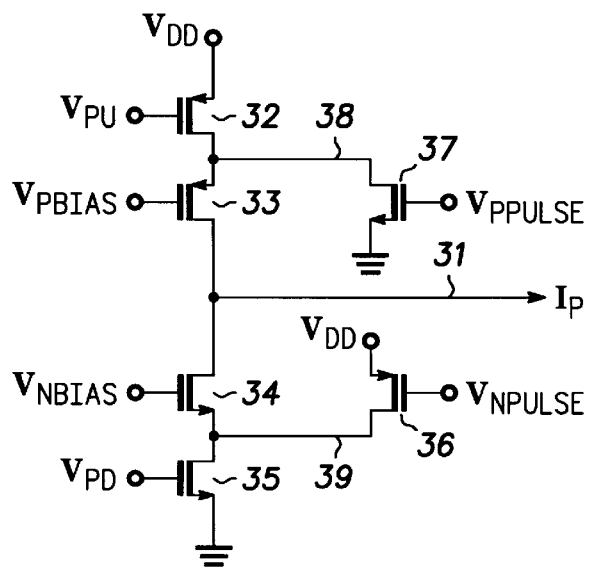
FIG. 3 is a schematic diagram of a charge pump circuit.

FIG. 3 is a schematic diagram of charge pump 26 providing $I_p$ current pulses at an output 31, and including transistors 32–37. $V_{PBIAS}$ and $V_{NBIAS}$ are generated in a regulator circuit (not shown) to set the amplitude of the $I_p$ pulses. In one embodiment, $I_p$ has a value of ten microamperes set by a transistor gate-source voltage of 0.8 volts, such that transistor 33 is biased at $V_{PBIAS}=V_{DD}-0.8=2.2$ volts to supply ten microamperes of charging current. $V_{NBIAS}$ is set to 0.8 volts so that transistor 34 supplies ten microamperes of discharging current when enabled. Therefore, $I_p$ can have a value of zero or plus or minus ten microamperes. Switching signals $V_{PU}$ and $V_{PD}$ are derived from, and have similar pulse widths, as UP and DOWN, as described below. $V_{PU}$ is active when at a logic low level and $V_{PD}$ is active at a logic high level.

Those skilled in the art understand that transistors have a conduction path formed between first and second conduction electrodes which is modified with a control voltage applied to a control electrode of the transistor. For example, in a metal-oxide-semiconductor transistor, the first and second conduction electrodes correspond to the drain and source electrodes of the transistor and the control electrode corresponds to the gate electrode. A channel formed between the drain and source provides the conduction path, which is activated or enabled when a voltage greater than a conduction threshold of the transistor is applied across the gate and source electrodes. The conduction path is deactivated or disabled when a voltage less than the conduction threshold is applied.

Figure 4:
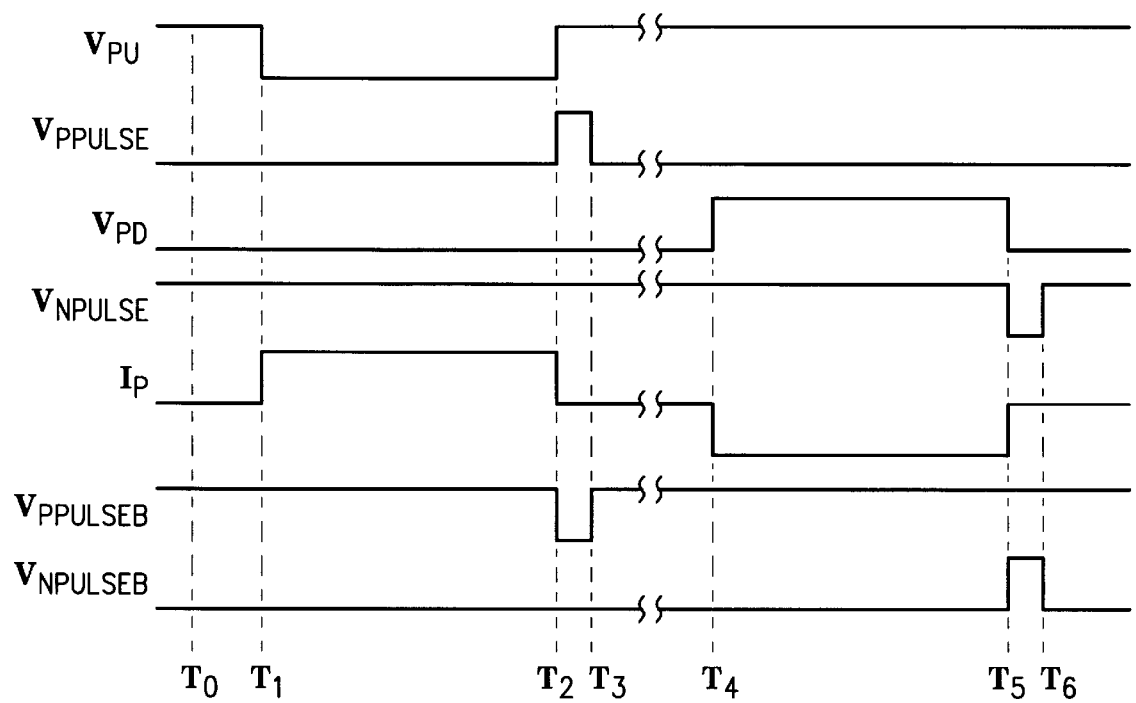
FIG. 4 is a timing diagram of charge pump signals.

The operation of charge pump 26 is seen by referring to the timing diagram of FIG. 4. Transistors 32 and 35 operate as switches in response to $V_{PU}$ and $V_{PD}$, respectively, to enable $I_p$ current pulses through transistors 33 and 34 to output 31. Transistors 32 and 35 have nearly zero volts from drain to source when switched on. Initially, at time $T_0$, $V_{PU}$ and $V_{PD}$ are inactive and $I_p$ is zero. At time $T_1$, $V_{PU}$ is activated to turn on transistor 32 and produce an $I_p$ pulse, shown in FIG. 4 as having a positive magnitude. At time $T_2$, $V_{PU}$ terminates and transistors 32 and 33 are switched off, restoring $I_p$ to zero current. Similarly, at time $T_4$, $V_{PD}$ is active, switching on transistors 35 and 34 to produce $I_p$ having a negative magnitude as shown. At time $T_5$, $V_{PD}$ terminates and transistors 35 and 34 are switched off, again restoring $I_p$ to zero current. As shown in FIG. 3, node 38 is a switching node whose parasitic capacitance is charged through switching transistor 32, which is enabled at the leading edge of $V_{PU}$ to provide a low impedance charging path. Similarly, node 39 is a switching node whose parasitic capacitance is charged through transistor 35, which is enabled at the leading edge of $V_{PD}$ to provide a low impedance path.

The present invention improves on prior art charge pumps by routing the stored charge through a charge conduction path to a discharge node on the trailing edge of the detection pulse, while disabling the charge conduction path to isolate the switching node from the discharge node at the leading edge. For example, transistor 37 operates as a charge conduction path which alters the stored charge on node 38 by routing the charge through transistor 37 to a discharge node, i.e., ground, in response to $V_{PPULSE}$. Similarly, transistor 36 operates as a charge conduction path to alter the stored charge on node 39 by routing the charge through transistor 36 to a discharge node, i.e., $V_{DD}$, in response to $V_{NPULSE}$. Transistors 37 and 36 typically are small transistors which add minimal capacitance to nodes 38 and 39 in comparison to the capacitor circuits of prior art charge pumps.

The leading edge of $V_{PPULSE}$ coincides with the trailing edge of $V_{PU}$. $V_{PPULSE}$ terminates before the next detection pulse, so transistor 37 is disabled before $V_{PU}$ again becomes active, thereby isolating node 38 from ground to prevent a delay in enabling transistor 33. The leading edge of $V_{NPULSE}$ commences at the trailing edge of $V_{PD}$. $V_{NPULSE}$ terminates before the next detection pulse, so transistor 36 is disabled while $V_{PD}$ is active, which isolates node 39 from $V_{DD}$ to prevent a delay in enabling transistor 34. $V_{PPULSE}$ is derived from UP as described below to terminate after a few gate delays to allow charge pump 26 to stabilize before the next detection pulse and to prevent transistors 32 and 37 from being enabled at the same time to generate an undesirable current spike. Similarly, $V_{NPULSE}$ is derived from DOWN to terminate after a few gate delays to allow charge pump 26 to stabilize before the next cycle and to prevent transistors 35 and 36 from being enabled at the same time.

Figure 5:
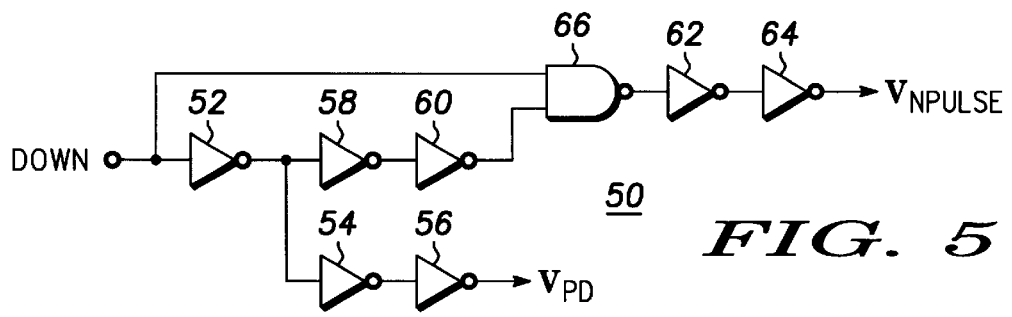
FIG. 5 is a schematic diagram of a pulse generator.

FIG. 5 is a schematic diagram of a pulse generator circuit 50 for generating $V_{PD}$ and $V_{NPULSE}$ from digital detection pulse DOWN, including inverters 52–64 and a NAND logic gate 66. The relationship of $V_{PD}$ and $V_{NPULSE}$ is shown in FIG. 4. Pulse generator circuit 50 is formed on an integrated circuit, so that NAND gate 66 and inverters 52–64 have essentially equal gate delays.

Detection pulse DOWN is coupled through a delay line comprised of inverters 52–56 which inverts DOWN to produce $V_{PD}$ after three gate delays. Hence, the leading edge of $V_{PD}$ occurs at time $T_4$, three gate delays after the leading edge of DOWN. The trailing edge of $V_{PD}$ occurs at time $T_5$, three gate delays after the trailing edge of DOWN, as shown in FIG. 4.

DOWN is also routed through NAND gate 66 and inverters 62–64 to initiate $V_{NPULSE}$ to coincide with the trailing edge of $V_{PD}$ at time $T_5$, three gate delays after the trailing edge of DOWN. Inverters 52 and 58–60 operate as a delay line to set the pulse width of $V_{NPULSE}$ for switching NAND gate 66 to terminate $V_{NPULSE}$ after three gate delays at time $T_6$.

It should be evident that alternate embodiments of pulse generator 50 can be used to accomplish a similar function, whether DOWN is active at a logic high level or logic low level. A similar pulse generator circuit is used to derive $V_{PPULSE}$ and $V_{PU}$ from UP such that the leading edge of $V_{PPULSE}$ coincides with the trailing edge of $V_{PU}$.

The discharging of switching nodes to either $V_{DD}$ or ground potential reduces the output dynamic range of the charge pump. In particular, as the output approaches ground potential, the current source transistor becomes forward biased to form a channel that causes the transistor to operate in the inverse mode. The channel couples the output to the switching node, which drains charge from the output to equalize the potentials of the output and the switching node. The amount of drained charge is determined by the voltage across the channel. In particular, the drained charge increases as the difference between the switching node and output potentials increases. Because the switching node is discharged to the same potential as the discharge node, the drained charge increases as the difference between the switching and discharge nodes increases. For example, assume that a switching node is discharged to $V_{DD}$, so that when the output approaches ground, a total of $V_{DD}$–0.0=3.0 volts is applied across the channel of the inverted device. If another switching node is discharged to ground and the output approaches $V_{DD}$, a total of $V_{DD}$–0.0=3.0 volts is applied across the channel of the inverted current source device.

Figure 6:
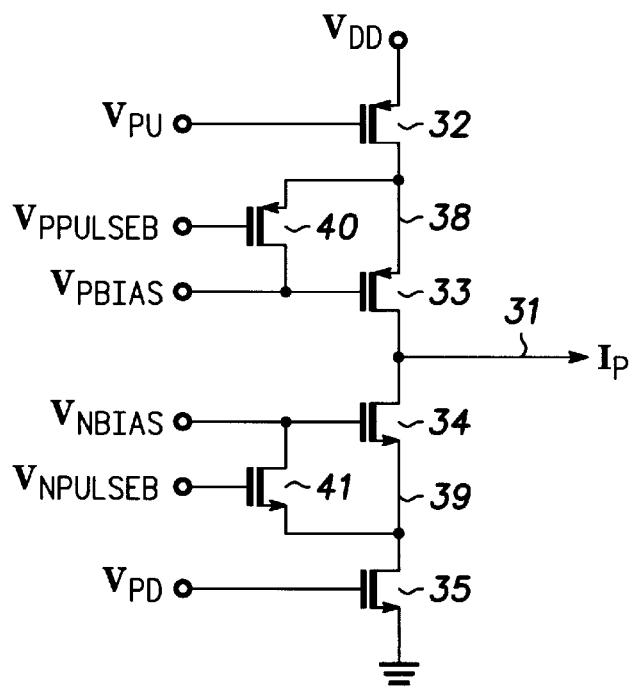
FIG. 6 is a schematic diagram of another charge pump.

FIG. 6 is a schematic diagram of charge pump 26 in an alternate embodiment having an increased dynamic range, including transistors 32–35 and 40–41. Transistors 32–35 operate as described in the embodiment of FIG. 3. Pulse signals $V_{PPULSEB}$ and $V_{NPULSEB}$ are inverted forms of $V_{PPULSE}$ and $V_{NPULSE}$ which are generated by a circuit similar to pulse generator circuit 50. Hence, $V_{PPULSEB}$ and $V_{NPULSEB}$ have timing similar to $V_{PPULSE}$ and $V_{NPULSE}$, as shown in FIG. 4. The increased dynamic range results from configuring $V_{PBIAS}=V_{DD}$–0.8=2.2 volts and $V_{NBIAS}$=0.8 volts to also operate as discharge nodes as shown.

For example, as node 31 approaches ground potential, the gate to drain voltage of transistor 34 becomes forward biased and forms a drain-source channel to operate transistor 34 in the inverse mode. The channel couples node 39 to output 31 and drains charge from output 31 to equalize the potentials of node 39 and output 31. However, the charge on node 39 is altered by discharging to $V_{NBIAS}$=0.8 volts so that the drain-source potential of transistor 34 is reduced to $V_{NBIAS}$–0.0=0.8 volts. Similar charge draining occurs when transistor 33 is inverted as output 31 approaches $V_{DD}$. The drained charge is similarly reduced by reducing the drain-source potential of transistor 33 to $V_{DD}$–$V_{PBIAS}$=0.8 volts.

Charge pump 26 has a further benefit of reduced voltage swings at nodes 38 and 39 which result in faster operation. In particular, node 38 swings from ground to $V_{NBIAS}$, or 0.8 volts, and node 38 swings from $V_{DD}$=3.0 volts to $V_{PBIAS}$= 2.2 volts, or 0.8 volts. The smaller swing turns transistors 33 and 34 off more quickly to divert more of the stored charge to the discharge node to further reduce $I_p$ error.

Figure 7:
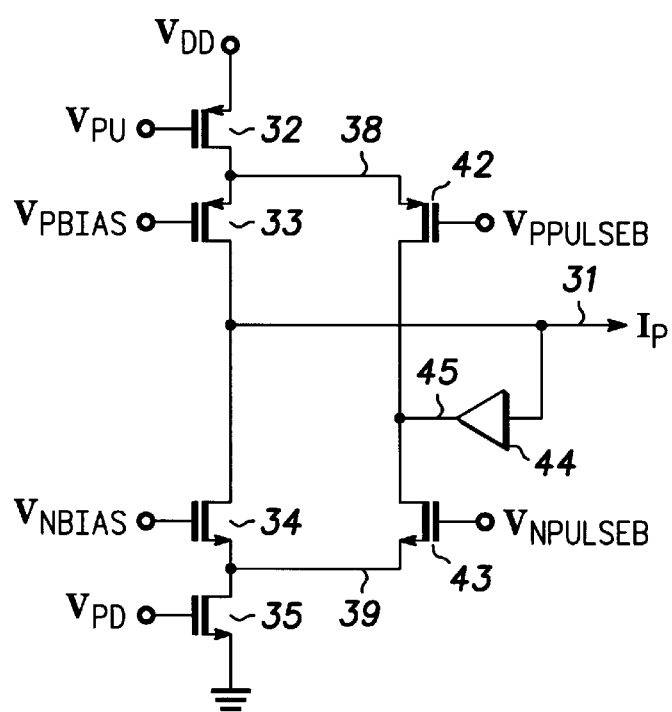
FIG. 7 is a schematic diagram of yet another charge pump.

FIG. 7 is a schematic diagram of charge pump 26 in another embodiment, including transistors 32–35 and 42–43 and an amplifier 44. Transistors 32–35 have similar operation as described in FIG. 3. Transistors 42 and 43 are activated by $V_{PPULSEB}$ and $V_{NPULSEB}$ to alter the stored charges by discharging nodes 38 and 39. Amplifier 44 is a unity gain amplifier which produces an output voltage at node 45 which operates as a discharge node having a potential substantially equal to that of output 31. The drain electrodes of transistors 42 and 43 are coupled for discharging nodes 38 and 39 to node 45.

As described above, when output 31 approaches $V_{DD}$ or ground, transistor 33 or 34 is inverted, which produces a conduction path at node 38 or 39 to drain charge from output 31. That is, when output 31 approaches ground, transistor 34 inverts and charge flows between output 31 and node 39 to equalize their potentials. By discharging node 39 to node 45, whose potential equals that of output 31, no charge flows in the channel that is drained from output 31. Similarly, node 38 is discharged to node 45 at the same potential as output 31. Therefore, the charge drained as output 31 approaches $V_{DD}$ is zero. Because zero error is generated, output 31 can swing closer to $V_{DD}$ or ground, thereby increasing the dynamic range of charge pump 26.

By now it should be appreciated that the present invention provides an improved charge pump circuit and method for producing a pump current at the output of the charge pump. A current source transistor is coupled at a node to a switching transistor to provide a current conduction path that produces a pump current of a specified magnitude in response to an input pulse. A charge is stored on parasitic capacitance of the node. A discharge transistor reduces pump current error by providing a charge conduction path which is enabled on one transition edge of the input pulse to alter the charge by routing to a discharge node. The charge conduction path is disabled on the other transition edge to isolate the node from the output.

What is claimed is:

1. A charge pump, comprising:
   a first current conduction path responsive to a first input pulse for supplying a pump current to an output of the charge pump; and
   a charge circuit coupled to a first node of the first current conduction path where the charge circuit is disabled during a first transition of the first input pulse and enabled during a second transition of the first input pulse to alter a charge on the first node.

2. The charge pump of claim 1, wherein the charge circuit includes a first transistor having a control electrode responsive to the first input pulse and a conduction path coupled to the first node for routing the charge to a first discharge node of the charge pump.

3. The charge pump of claim 2, further comprising an amplifier having an input coupled to the output of the charge pump and an output for setting a potential of the first discharge node equal to a potential of the output of the charge pump.

4. The charge pump of claim 2, wherein the first current conduction path further comprises:
   a first current source transistor having a control electrode coupled for receiving a first bias voltage, a first conduction electrode coupled to the first node, and a second conduction electrode for providing the pump current; and
   a first switching transistor having a control electrode responsive to the first input pulse for modifying a conduction path coupled between the first node and the first discharge node.

5. The charge pump of claim 4, wherein the first input pulse is received at an input of the first current conduction path, further comprising a pulse generator including:
   a delay line having an input responsive to the first input pulse and an output for producing a delayed pulse after a specified delay; and
   a first logic gate having a first input coupled for receiving the first input pulse, a second input coupled for receiving the delayed pulse, and an output coupled to the input of the first current conduction path for producing a discharge pulse that terminates after the specified delay.

6. The charge pump of claim 4, further comprising:
   a second current source transistor having a control electrode coupled for receiving a second bias voltage, a first conduction electrode coupled to a second node, and a second conduction electrode coupled to the output of the charge pump; and
   a second switching transistor having a control electrode responsive to a second input pulse for modifying a conduction path coupled between the second node and a power supply conductor.

7. The charge pump of claim 6, wherein the charge circuit further comprises a second transistor having a control electrode responsive to the second input pulse and a conduction path coupled between the second node and a second discharge node.

8. The charge pump of claim 1 where the charge pump is disposed on an integrated circuit.

9. The charge pump of claim 8 where the integrated circuit includes:

a phase detector for sensing a phase between an oscillator signal and a reference signal to produce the first and second input pulses ; and
a voltage controlled oscillator (VCO) operating in response to the pump current for providing the oscillator signal at an output.

10. An integrated circuit including a charge pump, the charge pump comprising:
    a first current conduction path responsive to a first input pulse for supplying a first pump current to an output of the charge pump;
    a first pulse generator having an input coupled for receiving the first input pulse and an output providing a first control signal that is inactive during a first transition of the first input pulse and active during a second transition of the first input pulse; and
    a first charge conduction path coupled to a node of the first current conduction path to alter a charge on the node and having a control input coupled for receiving the first control signal from the pulse generator.

11. The integrated circuit of claim 10, further comprising:
    a phase detector having first and second inputs respectively coupled for receiving an oscillator signal and a reference signal, and a first output for providing the first input pulse when the oscillator signal leads the reference signal in phase; and
    a voltage controlled oscillator having a control input coupled to the output of the charge pump for providing the oscillator signal at an output.

12. The integrated circuit of claim 11, wherein the phase detector has a second output for providing a second input pulse when the oscillator signal lags the reference signal in phase, further comprising:
    a second current conduction path responsive to the second input pulse for supplying a second pump current to the output of the charge pump;
    a second pulse generator having an input coupled for receiving the second input pulse and an output providing a second control signal that is inactive during a first transition of the second input pulse and active during a second transition of the second input pulse; and
    a second charge conduction path coupled to a node of the second current conduction path to alter a charge on the node and having a control input responsive to the second control signal.

13. The integrated circuit of claim 12, wherein the first and second pump currents are opposite in polarity.

14. The integrated circuit of claim 13, wherein the first and second charge conduction paths route the charges on the first and second nodes, respectively, to a discharge node, further comprising an amplifier having an input coupled to the output of the charge pump and an output for setting a potential of the discharge node equal to a potential of the output of the charge pump.

15. A wireless communication device, comprising
    a receiver circuit having a first input coupled for receiving a radio frequency (RF) signal modulated with information, a second input coupled for receiving a local oscillator signal for mixing with the RF signal to produce an intermediate frequency (IF) signal, and including a demodulator for extracting the information from the IF signal;
    a voltage controlled oscillator having an output for providing the local oscillator signal at a frequency determined by a control signal;

a phase detector operating in response to the local oscillator signal and a reference signal, and having a first output for providing a first detection pulse when the local oscillator signal leads the reference signal in phase;

a charge pump, including:
(1) a first current conduction path responsive to the first detection pulse for supplying a first pump current to an output of the charge pump; and
(2) a first charge circuit coupled to a first node of the first current conduction path where the first charge circuit is disabled during a first transition of the first detection pulse and enabled during a second transition of the first detection pulse to alter a charge on the first node.

16. The wireless communications device of claim 15, wherein the first detection pulse is received at an input of the current conduction path, and the charge pump further comprises a pulse generator including:

a delay line having an input responsive to the first detection pulse and an output for producing a delayed pulse after a specified delay; and a first logic gate having a first input coupled for receiving the first detection pulse, a second input coupled for receiving the delayed pulse, and an output coupled to the input of the first current conduction path for producing a discharge pulse that terminates after the specified delay.

17. The wireless communications device of claim 16, wherein the phase detector has a second output for providing a second detection pulse when the oscillator signal lags the reference signal in phase, the charge pump further comprising:

a second current conduction path responsive to the second detection pulse for supplying a second pump current to the output of the charge pump such that the first and second pump currents have opposite polarities;

a second pulse generator having an input coupled for receiving the second detection pulse and an output providing a second control signal that is inactive during a first transition of the second detection pulse and active during a second transition of the second detection pulse; and a second charge conduction path coupled to a node of the second current conduction path to alter a charge on the node and having a control input responsive to the second control signal.

18. A method of generating a charge pump current through a current conduction path in response to an input pulse, comprising the steps of:

disabling a charge conduction path from a node of the current conduction path during a first transition of the input pulse; and enabling the charge conduction path during a second transition of the input pulse to alter a charge on the node.

19. The method of claim 18, further comprising the steps of:

generating a control pulse with the second transition of the input pulse;

enabling the charge conduction path with the control pulse; and routing the charge to a discharge node.

20. The method of claim 19, wherein the step of generating includes a step of delaying the input pulse for a specified time period less than a period of the input pulse.

21. The method of claim 19, wherein the step of disabling includes a step of terminating the control pulse within the specified time period.

22. The method of claim 20, further comprising the steps of:

developing a voltage with the pump current; and amplifying the voltage to set a potential of the discharge node.

23. The method of claim 22, wherein the step of developing includes a step of filtering the charge pump current.

* * * * *